(12) United States Patent
Canniff

(10) Patent No.: US 10,096,471 B2
(45) Date of Patent: Oct. 9, 2018

(54) PARTIAL NET SHAPE AND PARTIAL NEAR NET SHAPE SILICON CARBIDE CHEMICAL VAPOR DEPOSITION

(71) Applicant: Lam Research Corporation, Fremont, CA (US)

(72) Inventor: Justin Charles Canniff, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/261,088

(22) Filed: Sep. 9, 2016

(65) Prior Publication Data

US 2018/0040479 A1    Feb. 8, 2018

Related U.S. Application Data

(60) Provisional application No. 62/370,916, filed on Aug. 4, 2016.

(51) Int. Cl.
*H01L 21/02*     (2006.01)
*H01L 21/304*    (2006.01)

(52) U.S. Cl.
CPC .... *H01L 21/02532* (2013.01); *H01L 21/0262* (2013.01); *H01L 21/02422* (2013.01); *H01L 21/02529* (2013.01); *H01L 21/304* (2013.01)

(58) Field of Classification Search
None
See application file for complete search history.

(56) References Cited

U.S. PATENT DOCUMENTS

| | | | | |
|---|---|---|---|---|
| 5,376,214 A | * | 12/1994 | Iwasaki | G01N 21/31 156/345.15 |
| 2012/0080092 A1 | * | 4/2012 | Singh | B82Y 30/00 136/262 |
| 2014/0272459 A1 | * | 9/2014 | Daugherty | H01J 37/32477 428/654 |

* cited by examiner

*Primary Examiner* — Su C Kim
*Assistant Examiner* — David S Wilbert

(57) ABSTRACT

A method for fabricating a structure having surfaces exposed to plasma in a substrate processing system includes providing a sacrificial substrate having a first shape, machining the substrate into a second shape, the second shape having dimensions corresponding to a desired final shape of the structure, depositing a layer of material on the substrate, machining first selected portions of the layer of material to expose the substrate within the layer of material, removing remaining portions of the substrate, and machining second selected portions of the layer of material into the structure having the desired final shape without machining the surfaces of the structure that are exposed to plasma during processing.

17 Claims, 7 Drawing Sheets

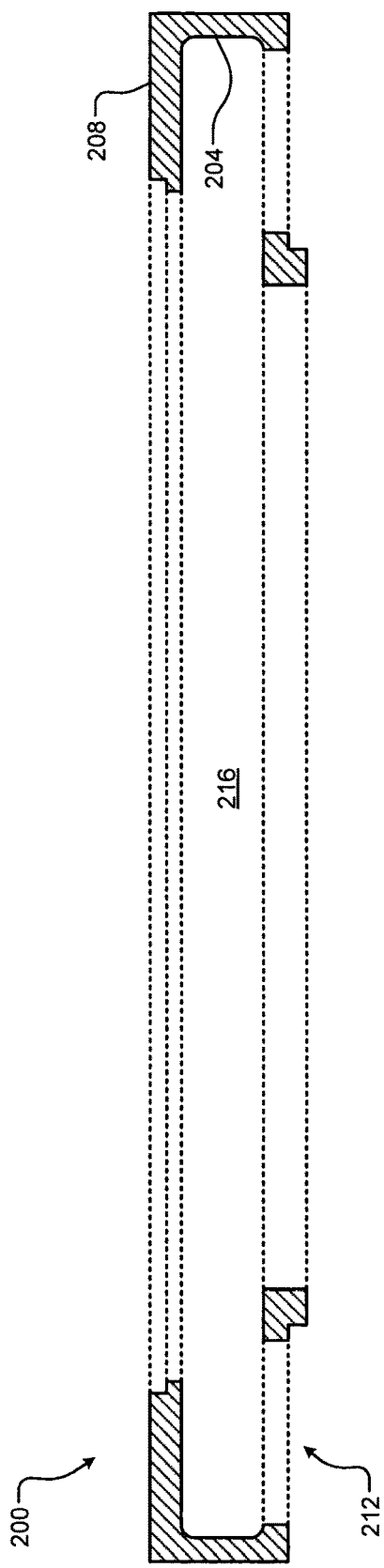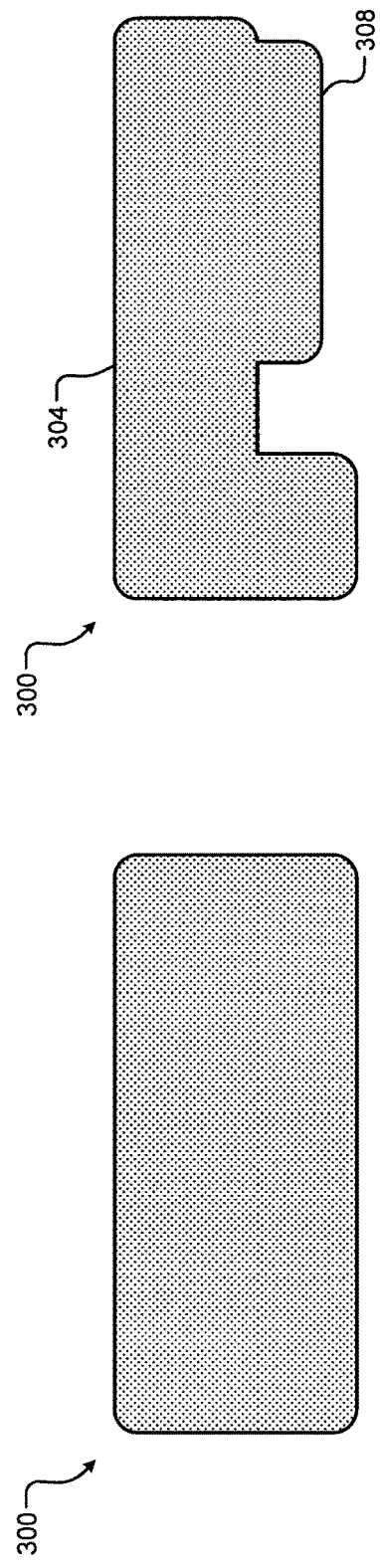

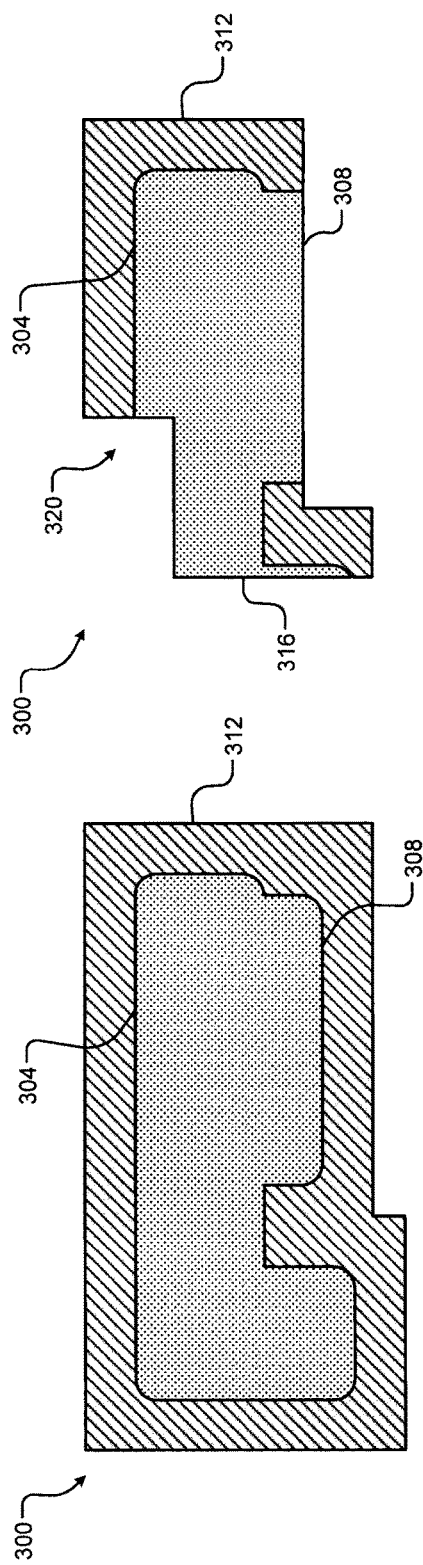
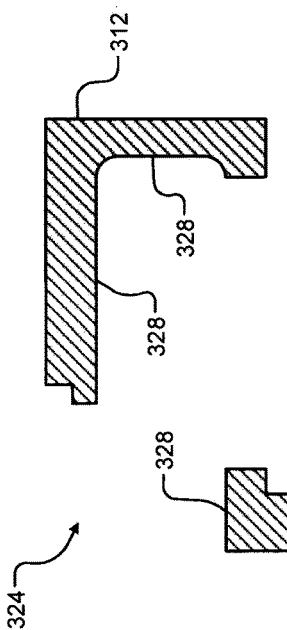
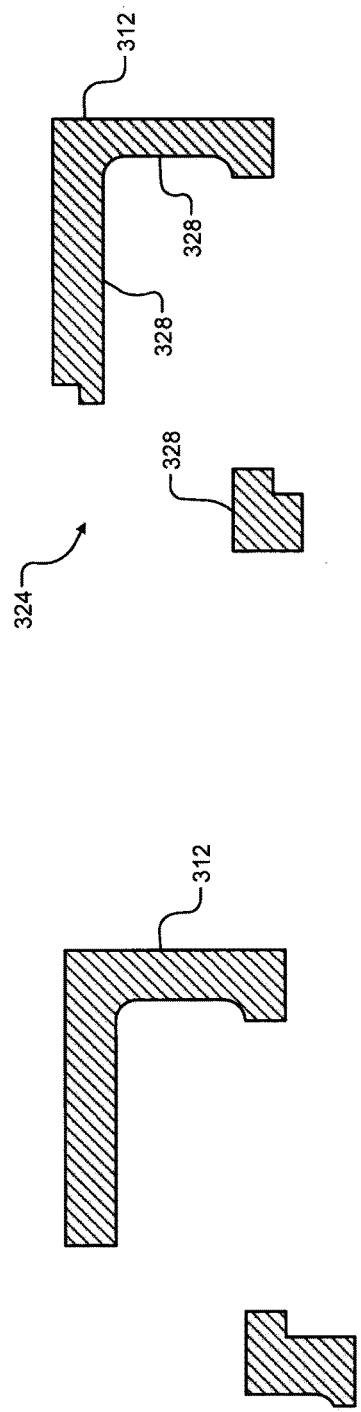
FIG. 3C
FIG. 3D
FIG. 3E
FIG. 3F

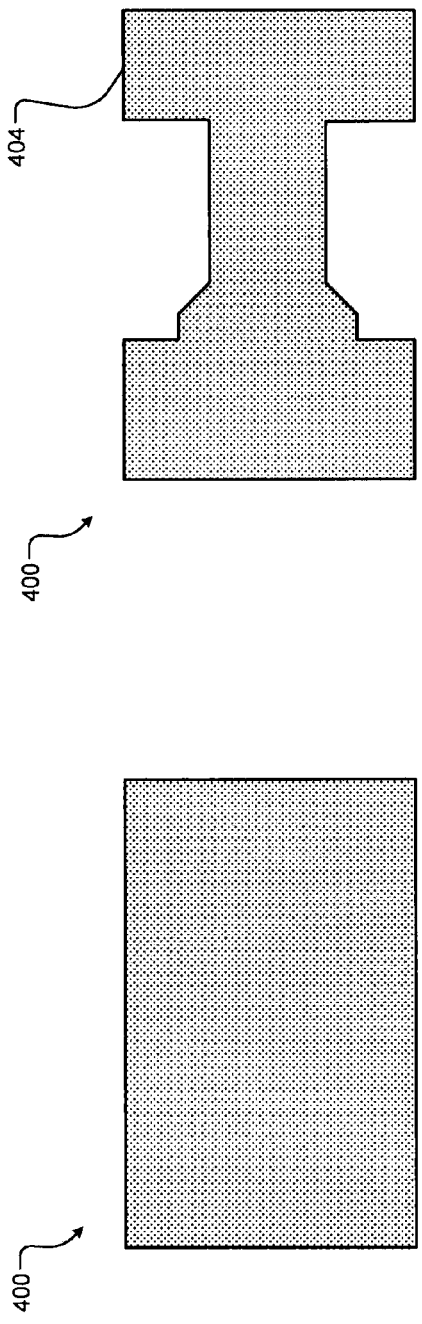
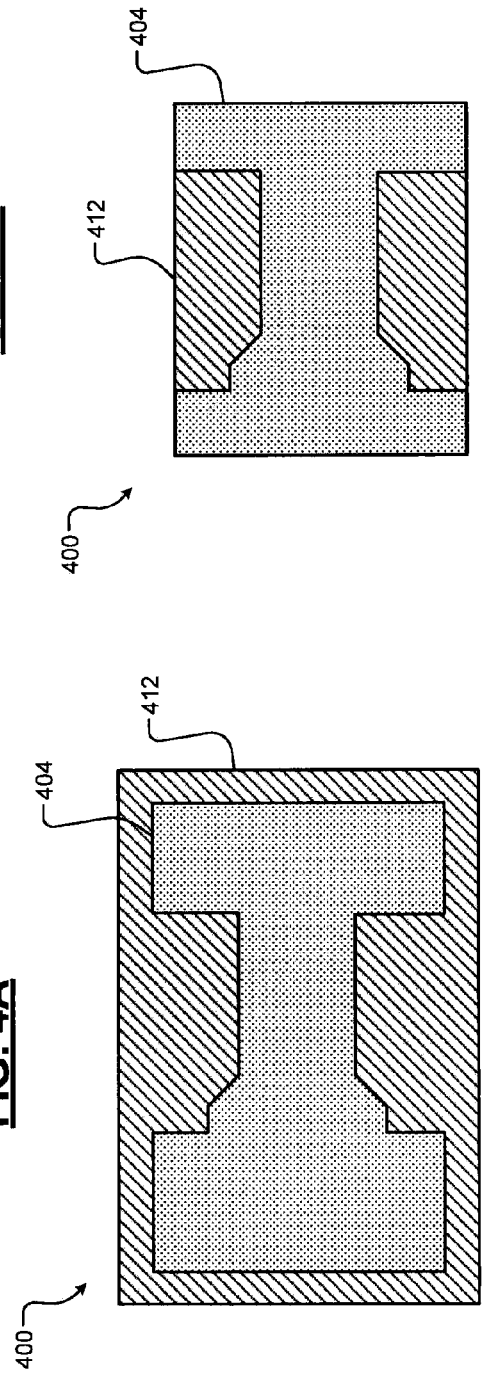
FIG. 4A
FIG. 4B
FIG. 4C
FIG. 4D

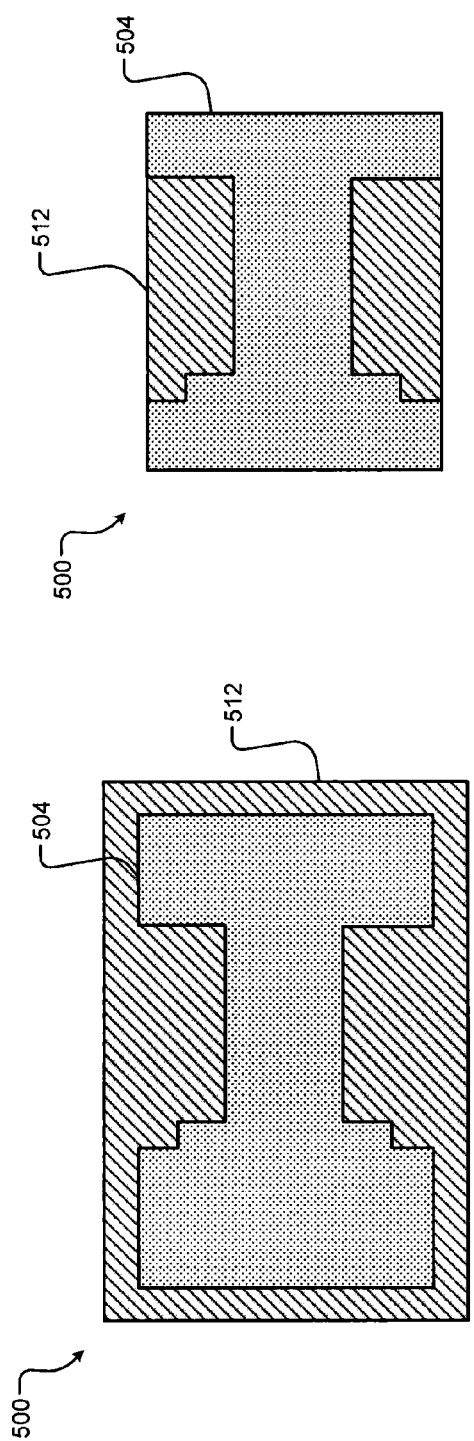
FIG. 5C
FIG. 5E
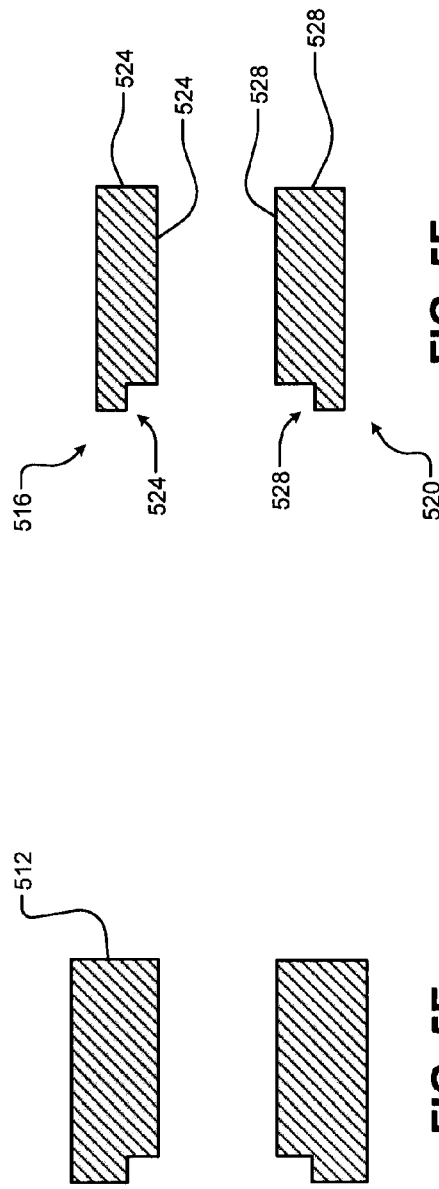
FIG. 5D
FIG. 5F

PARTIAL NET SHAPE AND PARTIAL NEAR NET SHAPE SILICON CARBIDE CHEMICAL VAPOR DEPOSITION

CROSS-REFERENCE TO RELATED APPLICATIONS

This application claims the benefit of U.S. Provisional Application No. 62/370,916, filed on Aug. 4, 2016. The entire disclosures of the applications referenced above are incorporated herein by reference.

FIELD

The present disclosure relates to fabrication of components of substrate processing systems exposed to plasma during processing.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc. The substrate processing system may include a plasma confinement shroud arranged around each of the substrate support and an upper electrode (e.g., a showerhead) to further confine the plasma within the volume above the substrate.

SUMMARY

A method for fabricating a structure having surfaces exposed to plasma in a substrate processing system includes providing a sacrificial substrate having a first shape, machining the substrate into a second shape, the second shape having dimensions corresponding to a desired final shape of the structure, depositing a layer of material on the substrate, machining first selected portions of the layer of material to expose the substrate within the layer of material, removing remaining portions of the substrate, and machining second selected portions of the layer of material into the structure having the desired final shape without machining the surfaces of the structure that are exposed to plasma during processing.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2 is an example plasma confinement shroud according to the present disclosure;

FIGS. 3A through 3F illustrate example steps of a shroud fabrication process according to the present disclosure;

FIGS. 4A through 4F illustrate example steps of a first edge ring fabrication process according to the present disclosure;

FIGS. 5A through 5F illustrate example steps of a second edge ring fabrication process according to the present disclosure.

In the drawings, reference numbers may be reused to identify similar and/or identical elements.

DETAILED DESCRIPTION

Figure 1:
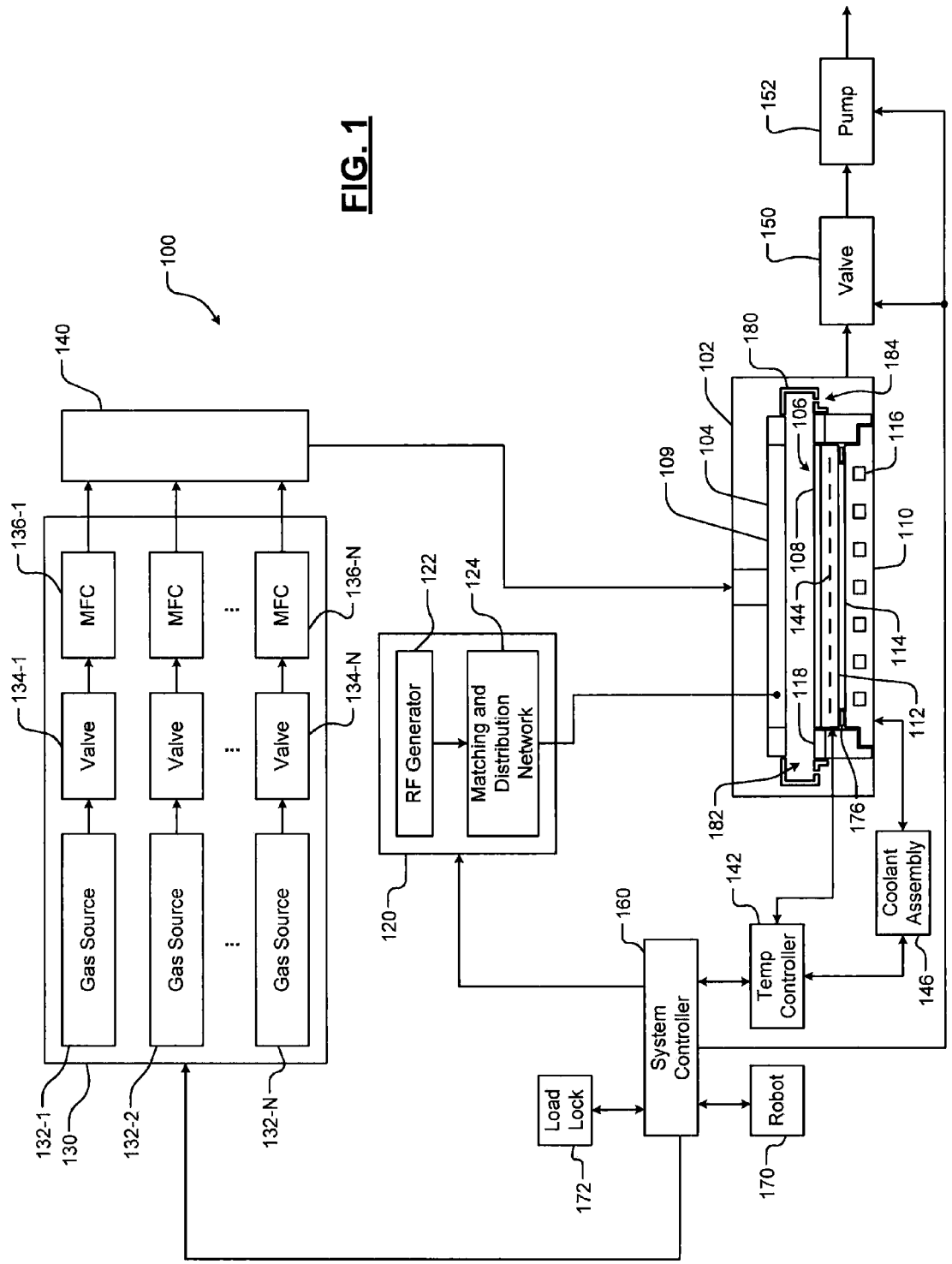
FIG. 1 is a functional block diagram of an example processing chamber according to the present disclosure.

A processing chamber of a substrate processing system may include a plasma confinement shroud. The shroud may be arranged to confine plasma and other reactants within a desired region in the processing chamber. For example, the shroud may be positioned to surround a substrate support and an upper electrode to confine the plasma within a volume above a substrate and below the upper electrode.

In some examples, plasma confinement shrouds are fabricated by depositing semiconductor material (e.g., silicon carbide, or SiC) on a sacrificial substrate. For example, the SiC is deposited on the substrate using a chemical vapor deposition (CVD) process. The substrate may comprise a graphite block or cylinder having a shape generally corresponding to a desired configuration (i.e., a final shape) of the shroud. The deposited material forms a SiC layer on and around the substrate. The layer deposited on the substrate is then machined (e.g., using various techniques such as cutting, grinding, etc.) into the final shape. This process may be referred to as a near net shape process.

Systems and methods according to the principles of the present invention implement a partial net shape or partial near net shape process. In the partial net shape or partial near net shape process, some surfaces of the deposited layer may require machining to achieve the final shape while other surfaces do not require machining. For example, the process may be configured such that less process critical surfaces of the shroud (e.g., non-plasma-facing surfaces) may require machining while plasma-facing surfaces of the deposited layer do not require machining.

For example, the graphite substrate may be machined prior to performing the deposition of the SiC layer (i.e., pre-machined). More specifically, the substrate is pre-machined into a shape (which may be referred to as a reciprocal or complementary shape) that more closely corresponds to the desired final shape and dimensions of the shroud. The SiC layer is then deposited onto the pre-machined substrate. Selected portions of the SiC layer and the substrate are machined, and the substrate is removed (e.g., burned out) from the SiC layer. Upon removal of the substrate, some portions and surfaces of the SiC layer will already correspond to the desired final shape of the shroud.

Accordingly, fabricating the shroud according to the principles of the present disclosure reduces machining, reduces damage to the surface finishes of the shroud, minimizes loss of product due to cracking caused by machining, and improves overall yield. Further, shrouds having more complex shapes can be fabricated without requiring extensive cutting, grinding, or other material removal methods that would risk damaging the shroud.

Although described with respect to a C-shroud, the principles of the present disclosure may also be applied to other structures within a substrate processing system, including, but not limited to, other types of plasma confinement shrouds, edge rings, structures associated with an upper electrode or showerhead, confinement rings, etc. Accordingly, edge rings, confinement rings, etc. having more complex shapes can be fabricated without requiring extensive cutting, grinding, or other material removal methods that would risk damaging the respective structures.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110. The substrate support 106 may include an edge ring 118 arranged to surround an outer perimeter of the substrate 108.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The processing chamber 102 may include a plasma confinement shroud, such as a C-shroud 180. The C-shroud 180 is arranged around the upper electrode 104 and the substrate support 106 to confine plasma within a plasma region 182. In some examples, the C-shroud 180 comprises a semiconductor material, such as silicon carbide (SiC). The C-shroud 180 may include one or more slots 184 arranged to allow gases to flow out of the plasma region 182 to be vented from the plasma chamber 106 via the valve 150 and the pump 152. The C-shroud 180 may be fabricated according to the principles of the present disclosure as described below in more detail.

Referring now to FIG. 2, an example plasma confinement shroud (e.g., a C-shroud) 200 is shown in cross section. The C-shroud 200 includes inner, plasma-facing surfaces 204 and outer, non-plasma-facing surfaces 208. The C-shroud 200 may include one or more slots 212 for allowing gases to be vented out of a plasma region 216 within the C-shroud 200.

Referring now to FIGS. 3A through 3F, an example fabrication process according to the principles of the present disclosure is shown. Although the fabrication process is described with respect to a C-shroud, the fabrication process may also be performed for other structures of a substrate processing system, including, but not limited to, an edge ring. The fabrication process may be referred to as a partial net shape or partial near net shape process. FIG. 3A shows a substrate such as a graphite block 300. FIG. 3B shows the block 300 machined into an example shape 304, which may correspond to a reciprocal or complementary shape of a desired final shape of the C-shroud. For example, machining the block 300 includes removing portions of the block 300 (e.g., via grinding, cutting, etc.) to achieve the shape 304. The shape 304 may include a projection or fin 308 corresponding to a location of a slot in the final shape. Although only a single projection 308 is shown, other examples may include two or more concentric projections corresponding to a plurality of slots formed in the C-shroud.

As shown in FIG. 3C, a semiconductor material such as silicon, SiC, or another silicon-containing material is deposited (e.g., using a CVD process) to form an SiC layer 312 on the block 300. For example only, the SiC layer 312 is deposited at a thickness corresponding to a maximum thickness (e.g., 0.365", or 9.271 mm) of any portion of the desired final shape. FIG. 3D shows the SiC layer 312 and the block 300 after portions of the SiC layer 312 and the block 300 are removed (e.g., via grinding). For example, portions of the projection 308, an inner diameter 316, and a top 320 of the block 300 and corresponding portions of the SiC layer 312 are removed.

Removing portions of the SiC layer 312 as shown in FIG. 3D allows remaining portions of the graphite block 300 to be exposed to various process gases. In one example, FIG. 3E shows the SiC layer 312 after the remaining portions of the graphite block 300 are removed. For example, the remaining portions of the block 300 may be removed via burning or another suitable process. The SiC layer 312 may be annealed subsequent to removing the remaining portions of the block 300 to improve the strength of the SiC layer 312 prior to any additional machining.

FIG. 3F shows the SiC layer 312 subsequent to further machining, grinding, etc. to form a C-shroud 324 having a final desired shape. As described, the C-shroud 324 was formed without performing any machining on inner, plasma-facing surfaces 328. Additional processing, such as oxidation and cleaning, may be performed on the C-shroud 324 prior to installation of the C-shroud 324 in a substrate processing chamber.

Figure 4E:
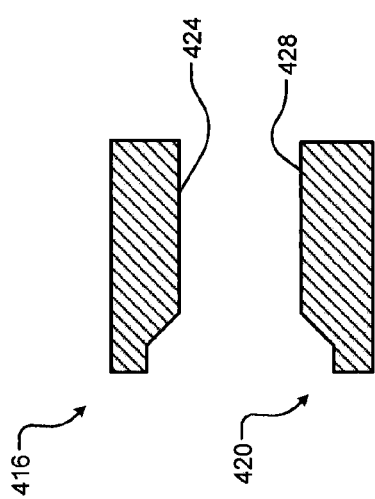
Figure 4F:
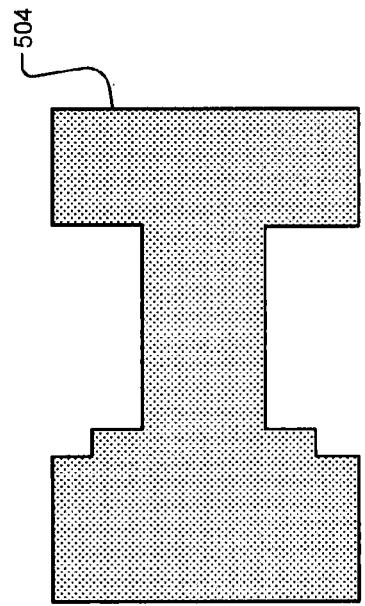

Referring now to FIGS. 4A through 4F, an example fabrication process for an edge ring according to the principles of the present disclosure is shown. FIG. 4A shows a substrate such as a graphite block 400. FIG. 4B shows the block 400 machined into an example shape 404, which may correspond to a reciprocal or complementary shape of a desired final shape of two edge rings. As shown in FIG. 4C, a semiconductor material such as silicon, SiC, or another silicon-containing material is deposited (e.g., using a CVD process) to form an SiC layer 412 on the block 400. FIG. 4D shows the SiC layer 412 and the block 400 after portions of the SiC layer 412 and the block 400 are removed (e.g., via grinding). FIG. 4E shows the SiC layer 412 after the remaining portions of the graphite block 400 are removed. The SiC layer 412 may be annealed subsequent to removing the remaining portions of the block 400 to improve the strength of the SiC layer 412 prior to any additional machining. FIG. 4F shows the SiC layer 412 subsequent to further machining, grinding, etc. to form edge rings 416 and 420 having respective final desired shapes. As described, the edge rings 416 and 420 were formed without performing any machining on respective plasma-facing surfaces 424 and 428. Additional processing, such as oxidation and cleaning, may be performed on the edge rings 416 and 420 prior to installation of the edge rings 416 and 420 in a substrate processing chamber.

Figure 5A:
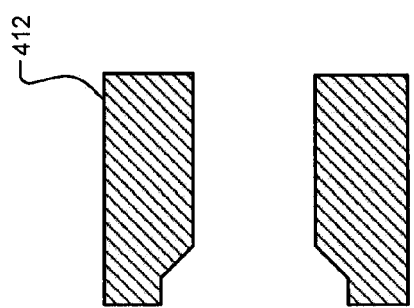
Figure 5B:
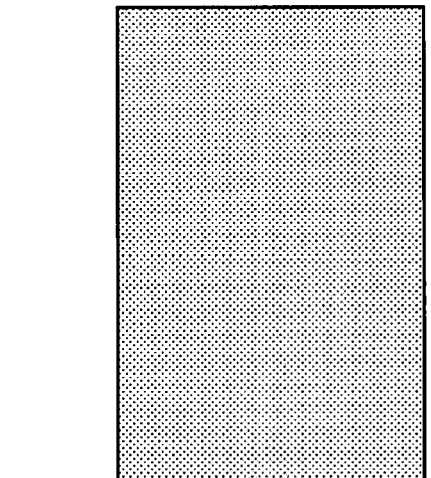

Referring now to FIGS. 5A through 5F, another example fabrication process for an edge ring according to the principles of the present disclosure is shown. FIG. 5A shows a substrate such as a graphite block 500. FIG. 5B shows the block 500 machined into an example shape 504, which may correspond to a reciprocal or complementary shape of a desired final shape of two edge rings. As shown in FIG. 5C, a semiconductor material such as silicon, SiC, or another silicon-containing material is deposited (e.g., using a CVD process) to form a layer 512 (e.g., in the present example, an SiC layer 512) on the block 500. FIG. 5D shows the SiC layer 512 and the block 500 after portions of the SiC layer 512 and the block 500 are removed (e.g., via grinding). FIG. 5E shows the SiC layer 512 after the remaining portions of the graphite block 500 are removed. The SiC layer 512 may be annealed subsequent to removing the remaining portions of the block 500 to improve the strength of the SiC layer 512 prior to any additional machining. FIG. 5F shows the SiC layer 512 subsequent to further machining, grinding, etc. to form edge rings 516 and 520 having respective final desired shapes. As described, the edge rings 516 and 520 were formed without performing any machining on respective plasma-facing surfaces 524 and 528. Additional processing, such as oxidation and cleaning, may be performed on the edge rings 516 and 520 prior to installation of the edge rings 516 and 520 in a substrate processing chamber.

Figure 6:
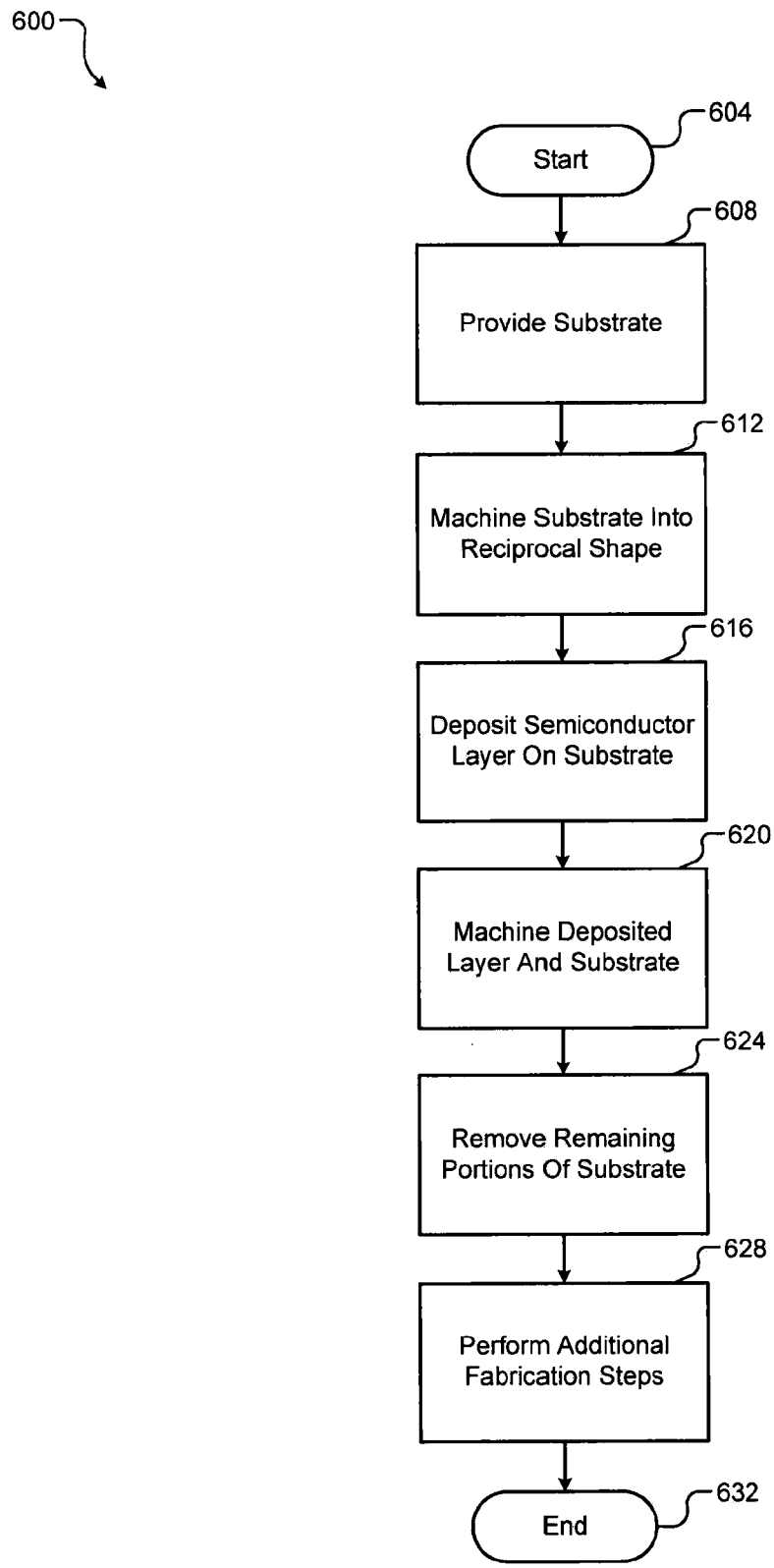
FIG. 6 illustrates steps of an example method of fabricating a structure of a substrate processing system according to the principles of the present disclosure.

Referring now to FIG. 6, an example method 600 of fabricating a structure (e.g., a shroud, edge ring, etc.) of a substrate processing system according to the principles of the present disclosure begins at 604. At 608, a substrate, such as a graphite block, is provided. At 612, the substrate is machined into a shape having features and/or dimensions that are reciprocal or complementary to a desired final shape of the structure. At 616, a material (e.g., a semiconductor material, such as a silicon-containing material) is deposited to form a layer on the machined substrate. For example, the layer corresponds to an SiC layer deposited on the substrate using a CVD process.

At 620, the deposited layer and the substrate are further machined (e.g., grinded) to remove portions of the layer and the substrate. At 624, remaining portions of the substrate are removed (e.g., via burning). At 628, any additional fabrication steps may be performed on the remaining semiconductor layer to complete the structure. For example only, additional fabrication steps include, but are not limited to, annealing, machining, oxidation and cleaning, etc. The method 600 ends at 632.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for fabricating a structure of a plasma processing chamber, the method comprising:
providing a sacrificial substrate having a first shape;
machining the substrate into a second shape, wherein at least a portion of the second shape is complementary or reciprocal to a desired final shape of the structure, wherein the structure is a component of the plasma processing chamber;
subsequent to machining the substrate into the second shape, depositing a layer of material directly on the substrate such that the layer of material at least partially surrounds the substrate;
machining first selected portions of the layer of material deposited on the substrate to expose the substrate at least partially surrounded by the layer of material;
removing remaining portions of the exposed substrate; and
machining second selected portions of the layer of material such that the layer of material is shaped into the structure without machining third selected portions of the layer of material, wherein the structure has an annular ring shape including an annular inner surface and an annular outer surface opposite the annular inner surface, wherein the third selected portions of the layer of material correspond to surfaces of the structure that are exposed to plasma during plasma processing that is performed in the plasma processing chamber subsequent to fabricating the structure, and wherein the third selected portions include the annular inner surface,
wherein the structure corresponds to one of a plasma confinement shroud and an edge ring.

2. The method of claim 1, wherein the structure corresponds to a plasma confinement shroud.

3. The method of claim 2, wherein the plasma confinement shroud corresponds to a C-shroud.

4. The method of claim 1, wherein the structure corresponds to an edge ring.

5. The method of claim 1, wherein the substrate includes a graphite block.

6. The method of claim 1, wherein the second shape includes at least one projection corresponding to a location of a slot in the plasma confinement shroud.

7. The method of claim 6, wherein machining the first selected portions of the layer of material includes removing portions of the layer of material corresponding to the projection.

8. The method of claim 1, wherein depositing the layer of material includes completely surrounding the substrate with the layer of material.

9. The method of claim 1, wherein machining the first selected portions of the layer of material includes removing selected portions of the substrate.

10. The method of claim 9, wherein, subsequent to removing the selected portions of the substrate, the surfaces of the structure that are exposed to plasma during the plasma processing that is performed in the plasma processing chamber subsequent to fabricating the structure are covered by remaining portions of the substrate.

11. The method of claim 1, wherein depositing the layer of material includes depositing the layer of material using a chemical vapor deposition process.

12. The method of claim 1, wherein the layer of material comprises a semiconductor material.

13. The method of claim 1, wherein the layer of material includes silicon.

14. The method of claim 1, wherein the layer of material includes silicon carbide.

15. The method of claim 2, wherein the plasma confinement shroud is configured to encircle a plasma processing volume in the plasma processing chamber, wherein the plasma confinement shroud further includes an annular upper wall, wherein the annular upper wall has a lower surface exposed to plasma, and wherein the annular outer surface is not exposed to plasma.

16. The method of claim 3, wherein the C-shroud has a C-shape, and wherein an interior of the C-shape includes the annular inner surface and the lower surface of the annular upper wall.

17. The method of claim 4, wherein the edge ring is configured to encircle a substrate in the substrate processing chamber, and wherein the annular outer surface is exposed to plasma.

* * * * *